US006339240B1

United States Patent
Kim

(10) Patent No.: US 6,339,240 B1
(45) Date of Patent: Jan. 15, 2002

(54) SEMICONDUCTOR MEMORY DEVICE

(75) Inventor: Jae Kap Kim, Ich'on (KR)

(73) Assignee: Hyundai Electronics Industries Co., Ltd., Kyoungki-do (KR)

(*) Notice: Subject to any disclaimer, the term of this patent is extended or adjusted under 35 U.S.C. 154(b) by 0 days.

(21) Appl. No.: 09/642,379

(22) Filed: Aug. 21, 2000

Related U.S. Application Data

(62) Division of application No. 09/104,561, filed on Jun. 25, 1998, now Pat. No. 6,121,079.

(30) Foreign Application Priority Data

Jun. 25, 1997 (KR) .............................. 97/27409

(51) Int. Cl.⁷ ...................... H01L 27/108; G11C 11/24
(52) U.S. Cl. ...................... 257/296; 257/390; 257/391; 257/903; 257/904; 257/908; 365/149; 365/189.04
(58) Field of Search .............................. 257/225, 260, 257/390, 391, 903, 904, 910, 296, 908; 365/51, 149, 189.01, 189.02, 189.03, 189.04, 189.05–189.12, 190, 191

(56) References Cited

U.S. PATENT DOCUMENTS

| | | | | |
|---|---|---|---|---|
| 4,578,776 A | * | 3/1986 | Takemae et al. ............ 365/149 |
| 4,618,945 A | * | 10/1986 | Sakurai et al. ............... 365/189 |
| 4,744,056 A | * | 5/1988 | Yu et al. ....................... 365/154 |
| 5,243,209 A | * | 9/1993 | Ishee ............................ 257/263 |
| 5,567,963 A | * | 10/1996 | Rao ............................. 257/296 |
| 5,831,897 A | * | 11/1998 | Hodges ....................... 365/156 |
| 6,271,569 B1 | * | 8/2001 | Ishigaki et al. .............. 257/381 |

FOREIGN PATENT DOCUMENTS

| | | | |
|---|---|---|---|
| EP | 0113187 | 7/1984 | |
| EP | 0 386 282 A1 | * 9/1990 | ............. G05F/3/20 |
| GB | 2309586 | 7/1997 | |

* cited by examiner

Primary Examiner—Jerome Jackson, Jr.
Assistant Examiner—José R. Diaz
(74) Attorney, Agent, or Firm—Selitto, Behr & Kim

(57) ABSTRACT

In DRAM comprising a read pass transistor, a write pass transistor and a storage transistor, a depletion transistor is connected to a source of the storage transistor. On a part of the source and drain of the depletion transistor, by forming an impurity region of same conductivity as that of the substrate on which the transistors are formed, a substrate voltage applied to the substrate is supplied to the storage transistor through the depletion transistor. An additional metal wire for connecting the source of the storage transistor to Vss voltage (ground voltage or substrate voltage) terminal and a contact hole area for such metal wire are not required. Accordingly, a high integration of the semiconductor can be accomplished and a reduction of reliability thereof can be decreased.

34 Claims, 5 Drawing Sheets

SEMICONDUCTOR MEMORY DEVICE

CROSS REFERENCE TO RELATED APPLICATIONS

This application is a divisional of U.S. patent Application. Ser. No. 09/104,561 filed Jun. 25, 1998 now U.S. Pat. No. 6,121,079.

BACKGROUND OF THE INVENTION

1. Field of the Invention

The present invention is directed to a semiconductor memory device and a method for manufacturing the same, and more particularly to a semiconductor memory device enabling a reduction of a memory cell in size and a method for manufacturing the same.

2. Description of the Related Art

Since unit cell of DRAM(Dynamic Random Access Memory) basically consists of one transistor and one capacitor, there is benefit that an area occupying the unit cell thereof is small. For manufacturing such DRAM, should be performed four-times polysilicon deposition process; a first polysilicon deposition process for a word line, a second polysilicon deposition process for a bit line, a third polysilicon deposition process for a storage node of a capacitor and a fourth polysilicon deposition process for a plate node of the capacitor. Therefore, the manufacturing process of the DRAM is complicated. Further, a read access port and a write access port both are connected to one data line, so an operation of the DRAM as a logic device is complicated.

In order to remove the above mentioned drawbacks, a method for manufacturing the DRAM by one-step polysilicon deposition process had been proposed.

In FIG. 1, DRAM has a pass transistor for writing, a pass transistor for reading, a storage transistor, a capacitor, word lines for driving the pass transistors and bit lines intersecting the word lines for a data-in and data-out. M1 represents the pass transistor for writing, M2 the storage transistor and M3 the pass transistor for reading. Word line WL1 for reading is connected to a gate of the read pass transistor M3. Word line WL2 for writing is connected to a gate of the write pass transistor M1. Bit line BL1 for writing is connected to a source of the write pass transistor M1. Bit line BL2 for reading is connected to a source of the read pass transistor M3. A drain of the write pass transistor M1 is connected to a gate of the storage transistor M2. A drain of the storage transistor M2 is connected to a drain of the read pass transistor M3. A source of the storage transistor is connected to a Vss voltage terminal. A parasitic capacitor C1 is formed between the drain of the write pass transistor and the gate of the storage transistor. As a capacitance of the capacitor C1 is increased, an amount of data stored in DRAM is increased.

A semiconductor memory device including a circuit of FIG. 1 is designed to determine that if Vss voltage level is detected through the bit line, data is stored in the DRAM cell or if the voltage level over Vss voltage level is detected, no data is in the DRAM cell.

In writing operation, the write word line WL2 is accessed and the write pass transistor M1 is turned on. Accordingly, data at the write bit line BL1 is, through the write pass transistor M1, stored in the capacitor C1.

In reading operation, the read word line WL1 is accessed and the read pass transistor M2 is turned on. The storage transistor M2 is turned on or off in response to data stored in the capacitor C1. If data is previously stored in the capacitor C1, the storage transistor C1 is turned on and the Vss voltage level is detected at the read bit line BL2. Otherwise, if no data is stored in the capacitor C1, the storage transistor M2 is turned off and the voltage level over Vss voltage level is sensed at the read bit line BL2.

FIG. 2 is a view showing a layout of DRAM in FIG. 1. Y1 and Y2 each represents DRAM cell unit area. A1 stands for a first active region on which the storage transistor M2 and the read pass transistor M3 are formed. A2 stands for a second active region on which the write pass transistor M3 is formed. 4A indicates a gate of the write pass transistor M1, 4B a gate of the storage transistor M2 and 4C a gate of the read pass transistor M3. Particularly, a width of the gate of the storage transistor M2 is proportional to the capacitance of the capacitor C1, so the width of the gate of the storage transistor M2 is designed larger than that of gates of the read pass transistor M3 and the write pass transistor M1. The reference 2 designates an element separating region isolating the first active region and the second active region. The reference 5 indicates both side portions of the gates 4A, 4B and 4C in the active regions A1, A2. C-1 is a contact hole between the source of the read pass transistor M3 and the read bit lines WL1. C-2 is a contact hole between the source of the storage transistor M2 and the Vss voltage terminal. C-3 is a contact hole between the source of the write pass transistor M1 and the bit line BL1. C-4 is a contact hole between the gate of the storage transistor M2 and the drain of the write pass transistor M1.

FIG. 3 is a sectional view along III–III' of FIG. 2. With reference to FIG. 3, a method for manufacturing DRAM as shown in FIG. 1 and FIG. 2 will be explained.

A device isolating region 2 for separating the first active region A1 and the second active region A2 is formed on a part of the semiconductor substrate 1. A gate oxide and polysilicon are successively deposited over the substrate 1, and then patterned in a known etching method to form gate oxides 3A, 3B, 3C and gates 4A, 4B, 4C. As mentioned above, a width of the gate 4B of the storage transistor M2 is larger than those of the gates 4A, 4C of the other transistors M1, M3. Thereafter, N type of impurity ions are implanted to the substrate on which the gates are formed, forming junction regions 5-1, 5-2, 5-3, 5-4, 5-5 of the respective transistor. The junction region 5-2 is a common junction region of the storage transistor M2 and the read pass transistor M3.

An insulating interlayer 6 provided with contact holes C-1, C-2, C-3 exposing the junction regions 5-1, 5-3, 5-5, is formed on the resultant having the transistors M1, M2, M3. Thereafter, metal wires 7-1, 7-2, 7-3 contacting with the junction regions via contact holes are formed.

As known from the above, in order to produce the DRAM having three transistors as shown in FIG. 2, four-contacts holes C-1, C-2, C-3, C-4 should be required. Accordingly, area for such DRAM is increased, so an integrated density of the semiconductor device is degraded.

Further, since a pitch between the metal wires 7-1, 7-2, 7-3 is smaller and smaller with the high integrated density of the semiconductor device, a reliability of the semiconductor device is debased.

SUMMARY OF THE INVENTION

Accordingly, an object of the present invention is to provide a semiconductor device improving a reliability thereof, with satisfying a high integrated density thereof and a method for manufacturing the same.

A semiconductor memory device according to a view of the present invention so as to accomplish the object of the present invention, comprises a first word line, a second word line, a first bit line, a second bit line and a first passer for passing a data loaded on the first bit line by a turn-on thereof when the first word line is accessed. The semiconductor memory device further has a storage for storing a data outputted from the first passer, a second passer for transferring a data stored in the storage to the second bit lines by turn-on thereof when the second word line is accessed and a supplier for providing a substrate voltage for the storage.

In an embodiment, the first word line and the second word line are respectively for writing and reading. The first bit line and the second bit line are respectively for writing and reading. The first passer includes a NMOS transistor and the supplier includes a NMOS transistor with P type of impurity region. The second passer and the storage each has NMOS transistor. In detail, a gate, a source and a drain of the first passer are respectively connected to the write word line, the write bit line and gate of the storage. A gate, a source and a drain of the second passer are respectively connected to the read word line, the read bit line and a drain of the storage. A source of the storage is connected to a source of the supplier. A gate of the supplier is connected to the write word line. The P type of impurity region is formed on a part of the drain of the supplier and is furnished with the substrate voltage. A capacitor is formed between the drain of the first passer and the gate of the storage.

A semiconductor memory device according to another view of the present invention so as to accomplish the object of the present invention, comprises a first active region of first conductivity type having a body disposed at a center of a region defined by four-unit cells area adjacent thereto and branches disposed and extending from the body to respective unit cell area, a second active region of the first conductivity type separated from the first active region by a selected distance and disposed over the two-unit cells area adjacent thereto and a depletion region of the second conductivity formed in the body. A substrate electrode region is disposed at a center of the depletion region. Also, the semiconductor memory device includes a storage formed on the branch of the first active region, a first passer formed on the branch of the first active region and connected to the storage, a supplier formed on the depletion region with the substrate electrode region, for providing a substrate voltage for the storage through the substrate electrode region and a second passer formed on the second active region and connected to the storage. Here, the first conductivity type is P type and the second conductivity is N type.

In an embodiment, the first passer is of a transistor with a gate across the first active region and a drain and a source of second conductivity type both formed at the first active region disposed at sides of the gate thereof. The supplier is of a transistor having a gate across the depletion region and a drain and a source of second conductivity type both formed at the depletion region disposed at sides of the gate thereof. In a part of either source or drain of the depletion region is disposed the substrate electrode region formed by implanting first type of impurity ions. The second passer is of a transistor with a gate across the second active region and a drain and a source of the second conductivity type both formed at the second active region disposed at sides of the gate thereof. The storage is of a transistor having a gate disposed and extending from the first active region to the second active region and a drain and a source of the second conductivity type both formed at the first active region disposed at sides of the gate thereof. The drain of the first passer and the drain of the storage are common. A width of the gate of the storage is larger than those of gates of the first and second passers.

In another embodiment, the gate of the second passer is integrated with the gate of the supplier.

According to still another view of the present invention so as to accomplish the object of the present invention, is provided a substrate having a first active region of the first conductivity type and a second active region of the same conductivity type both isolated from each other. A depletion region of the second conductivity type is formed in a part of the first active region. A first passer and a storage are formed on the first active region, a second passer is formed on the second active region and on the depletion region is formed a supplier, providing a substrate voltage for the storage. An insulating layer is formed on the resultant in which the first and second passers, the storage and the supplier are provided. Etching of the insulating is performed to form a first contact hole exposing a portion of the first passer, a second contact hole exposing a portion of the second passer and a third contact hole exposing another portion of the second passer together with a portion of the storage. Thereafter a first metal wire, a second metal wire and a third metal wire filling the first contact hole, the second contact hole and the third contact hole respectively are formed. A step of forming the first passer, second passer, the storage and the supplier comprises the steps of forming gate insulating layers and gates thereof, forming drains and sources thereof by implanting the first type of impurity ions to the first active region including the depletion region and the second active region and forming a substrate electrode region connected to a substrate voltage by implanting the first conductivity type of impurity ions to a portion of either drain or source of the supplier formed on the depletion region. Between the step of forming the first and second passer, the supplier and the storage and the step of forming the insulating layer, a silicide is formed on the gates, drains and sources of the first passer, the second passer, the supplier and the storage.

In DRAM with a write pass transistor, a read pass transistor and the storage transistor, in order to connect the source of the storage to the Vss voltage terminal without affecting the operation of DRAM, is provided a depletion transistor connected to the storage transistor, the write pass transistor and the substrate voltage. An impurity region of same conductivity to that of a substrate on which DRAM is formed, is formed in either drain or source of the depletion transistor, providing the substrate voltage for the source of the storage without additionally separate electrode. Is required no area for the contact hole through which the storage transistor is connected to the Vss voltage terminal, so the high integrated density can be accomplished. In addition, since the number of contact holes in DRAM of the present invention in comparison with the prior art, the pitch between the metal wires filling the contact holes is relatively larger and therefore a debasement of reliability of the semiconductor device can be reduced.

DESCRIPTION OF THE PRESENT INVENTION

Figure 1:
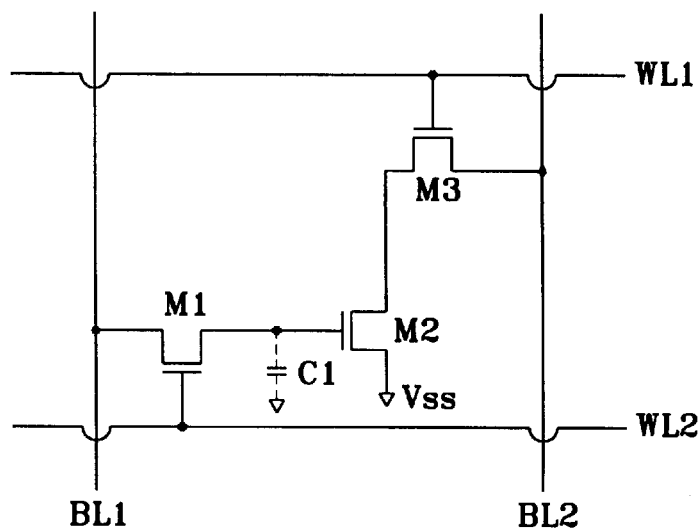
FIG. 1 is a DRAM circuit according to a conventional technique.
Figure 4:
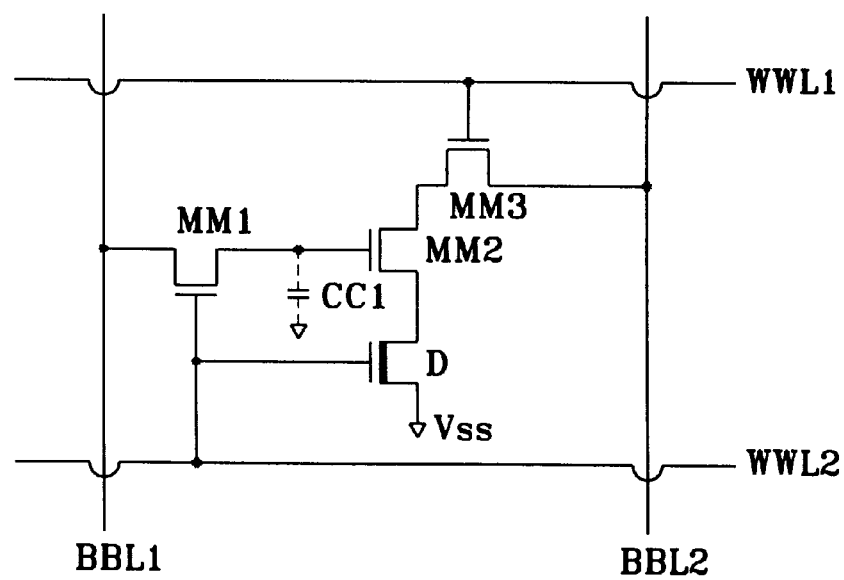
FIG. 4 is a DRAM circuit according to a present invention.

In similar to FIG. 1, FIG. 4 shows a DRAM circuit according to the present invention. A source of a write pass transistor MM1 is connected to a write bit line BBL1, a gate thereof is connected to a write word line WWL2 and a drain thereof is connected to a gate of a storage transistor MM2. A source of a read pass transistor MM3 is connected to a read bit line BBL2, a gate thereof is connected to a read word line WWL1 and a drain thereof is connected to a drain of the storage transistor MM2. A source of the storage transistor MM2 is connected to a source of a depletion transistor D. The storage transistor MM2 and the depletion transistor D both are of same conductivity type. The depletion transistor D has a gate connected to a write word line WWL2 and a gate of the write pass transistor MM1 and a drain connected to the Vss voltage level. Between the drain of the write pass transistor MM1 and the gate of the storage transistor MM2 is formed a parasitic capacitor CC1.

The depletion transistor D plays a role of a bridge applying the substrate voltage to the source of the storage transistor without affecting an operation of DRAM circuit operation. That is, the substrate voltage Vss is supplied to the storage by on the drain of the depletion transistor D forming a substrate electrode introducing the substrate voltage.

In write operation, the write word line WWL2 is accessed, so the write pass transistor MM1 is turned on. Accordingly, information of the write bit line BBL1 is stored in the capacitor CC1 via the write pass transistor MM1. The depletion transistor D is also turned on by a drive of the write word line WWL2. Since, data of the bit line BBL1, however, are charged in the capacitor CC1, the storage transistor MM2 maintains its initial state, turn-off state, and the write operation does not receive any affection.

Referring to a read operation, assume that the data is stored in the capacitor CC1. Then, the read word line WWL1 is driven to turn on the read pass transistor MM3. At this time, though the write word line WWL2 is not accessed, the depletion transistor D having the gate connected the word line WWL2, is turned on. Accordingly, Vss voltage level is detected at the read bit line BBL2. On the other hand, in case where no data is stored in the capacitor CC1, the storage transistor MM2 is turned off and the read pass transistor MM3 and the depletion transistor D are both turned on, high voltage level over the Vss voltage level being sensed at the read bit line BBL2.

Figure 5:
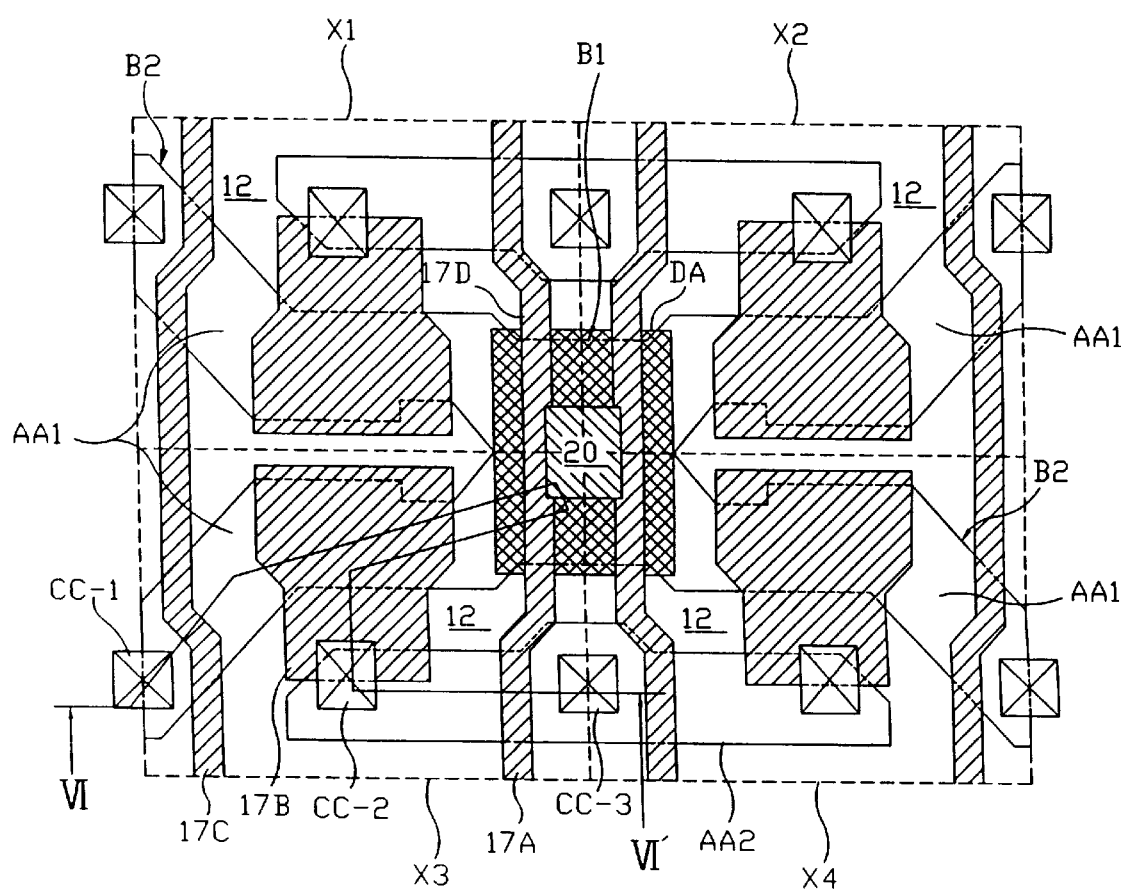
FIG. 5 is a layout of the circuit in FIG. 4.

FIG. 5 is a planar view of the circuit of FIG. 4 designed on a substrate. Boxes each depicted by dotted lines represents unit area of DRAM cell ($X_1$, $X_2$, $X_3$, and $X_4$). The DRAM cell is disposed in a region defined by adjacent four unit cell areas. In each unit cell area, AA1 represents a first active region on which the storage transistor MM2 and the read pass transistor MM3 are formed. AA2 is a second active region where the write pass transistor is formed. The numeral 12 indicates an element isolating region insulating the first active region from the second active region. The first active region and the second active region are both of P type conductivity. The first active region AA1 includes a body B1 at a center of the region defined by the adjacent four unit cell areas and branches B2 each disposed and extending from the body toward each unit cell area. At the body B1, the depletion region DA where the depletion transistor D will be formed is disposed. The depletion transistor DA is of N type conductivity. A substrate electrode region 20 introducing the substrate voltage is disposed at a center of the depletion region DA. The substrate electrode region 20 is of P type conductivity, same as the first active region and the second active region.

Numeral 17A is a gate for the write pass transistor MM1, 17B is a gate for the storage transistor, 17C is a gate for the read pass transistor MM3 and 17D is a gate for the depletion transistor D. The gate 17A is disposed over the depletion region DA and the second active region AA2. The gate 17B is disposed and extended at middle part of the unit cell area from a part of the first active region top a part of the second active region. The gate 17C is disposed over the first active region at a border of each unit cell area. As being proportional to a capacitance of the capacitor CC1, width of the gate 17B of the storage transistor MM2 is designed larger than those of gates 17C, 17A of the read pass transistor MM3 and the write pass transistor MM1. At P type active regions AA1, AA2 disposed both sides of the gates 17A, 17B, 17C, source and drain of N type are formed.

On the other hand, the source of the read pass transistor is through a contact hole CC-1 connected to the read bit line BBL2. The gate 17B of the storage transistor MM2 is via a contact hole CC-2 connected to the drain of the write bit line BBL1. In the present embodiment, the disposal of the bit lines and the supply voltage lines is omitted so as to apparently illustrate a layout of the embodiment in detail.

Figure 6A:
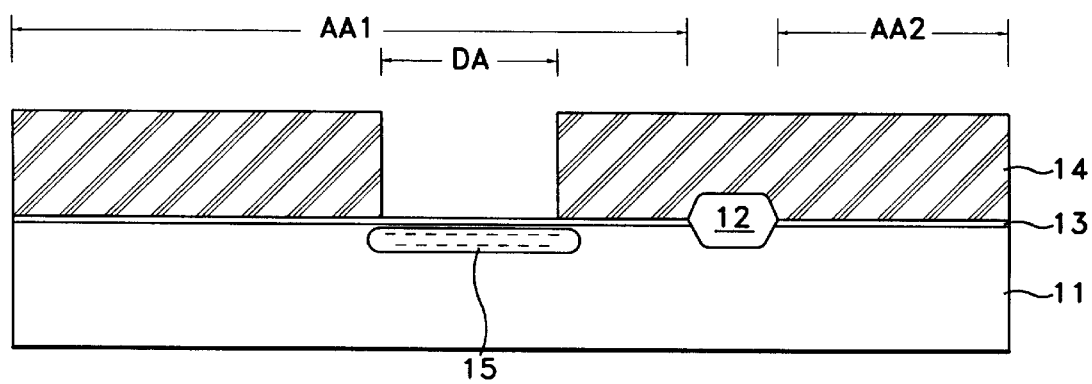
FIGS. 6A, 6B and 6C are sectional views along VI–VI', illustrating a method for manufacturing DRAM according to the present invention.
Figure 6B:
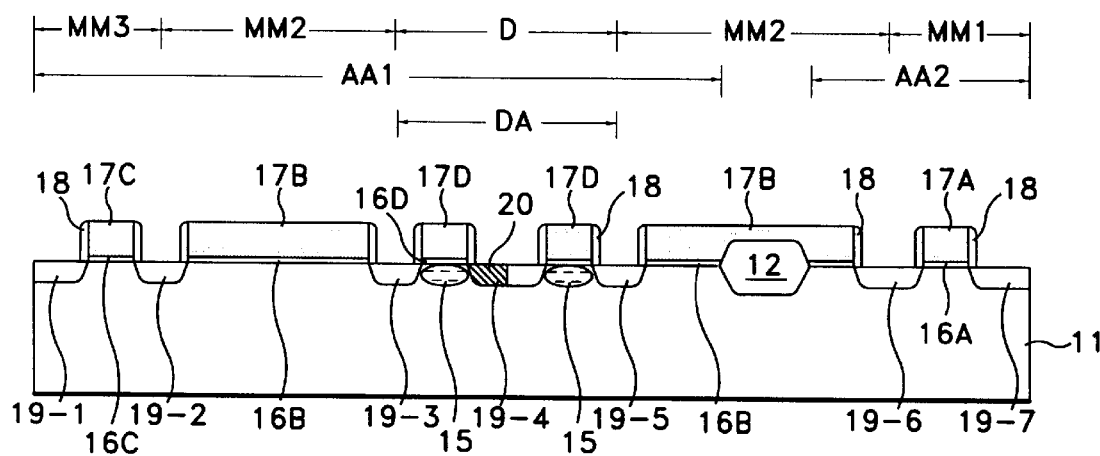
Figure 6C:
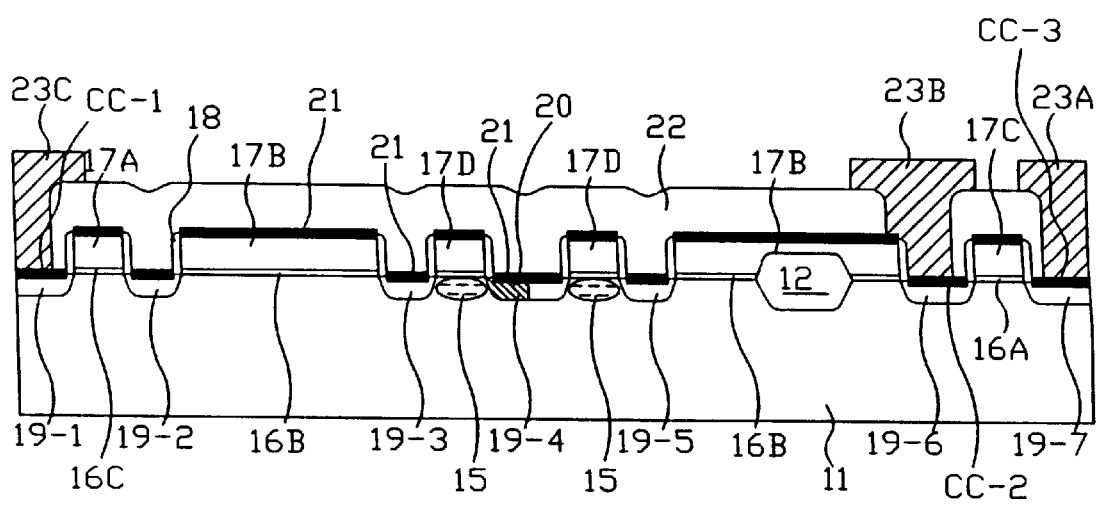

FIG. 6A to FIG. 6C is a sectional view along VI–VI' of FIG. 5, showing a method for manufacturing DRAM in FIG. 5.

Referring to FIG. 6A, By the well-known method the element isolating region 12 is formed on the semiconductor substrate. The semiconductor substrate 11 is formed of either silicon or chemical compound, or doped therein. In the present embodiment, the silicon substrate doped with P type impurity is used as the semiconductor substrate 11. A protective layer 13 for protecting the substrate surface is formed on the semiconductor substrate. A mask pattern 14 is formed over the protective layer 13 so as to exposed the depletion region DA. Thereafter, an implantation of N type impurity ion is performed to the substrate, forming the impurity region 15 of N type at the depletion region DA.

The process for the impurity region of N type is simultaneously carried out with the process for manufacturing an N type impurity region of PMOS transistor disposed at a peripheral circuit area, so the additionally independent process for the impurity region 15 is not required. The depletion region 15 of N type is for a channel of the depletion transistor D and a junction depth of the impurity region 15 is preferably not deeper than those of transistors MM1, MM2 and MM3.

Referring to FIG. 6B, the mask pattern 14 and the protective layer 13 are removed in a known manner. Thereafter, oxide layer and polysilicon layer are successively deposited on the substrate 11 and patterned, forming gate oxide layers 16 A, 16B, 16C and 16D and the gates 17A, 17B, 17C and 17D of the transistors MM1, MM2, MM3 and D. Spaces 18 are formed on both sides of gates 17A, 17B, 17C, 17D each in a well known manner. Then, the impurity ions of N type are implanted to the substrate 11, the junction regions 19-1, 19-2, 19-3, 19-4, 19-5, 19-6 and 19-7 of the transistors are formed. The junction region 19-7 is the source of the write pass transistor MM1, the junction region 19-6 is a common drain between the write pass transistor MM1 and the storage transistor MM2. The junction regions 19-5 and 19-3 each is the common source of the storage transistor MM2 and the depletion transistor D. The junction region 19-4 is the drain of the depletion transistor D and the junction region 19-2 is common drain of the storage transistor MM2 and the read pass transistor MM3. The junction region 19-1 is the source of the read pass transistor MM3. After forming the junction regions 19-1, 19-2, 19-3, 19-4, 19-5, 19-6 and 19-7, high impurity ions of P type are implanted to the part of the junction region 19-4, forming the substrate electrode region 20. The substrate electrode region 20 is connected to the P type substrate 11. Accordingly, a substrate voltage Vss preventing a floating of the substrate 11, is connected, through the transistor D formed on the depletion region DA, to the source of the storage transistor MM2 without additionally independent electrode. Since the process for the substrate electrode region 20 is carried out together with the process for the junction region of PMOS in the peripheral circuit, no additional implantation is needed.

In FIG. 6C, self-aligned silicide layers 21, 21' are formed on the gates 17A, 17B, 17C and 17D and the junction regions 19-1, 19-2, 19-3, 19-4, 19-5, 19-6 and 19-7. The silicide layers reduce a contact resistance of metal wires to be formed. In detail, transition metal such as titanium, chromium, platinum or nickel is deposited on the resultant of FIG. 6B. Then, a heating treatment of 500 through 800° C. is performed and the transition metal reacts the silicon, forming the silicide layers. Sequentially, the transition metal not reacting with the silicon is removed by $NH_4OH/H_2O_2/H_2O$ solution or $H_2SO_4/H_2O_2$ solution. After formation of the silicide layers 21, 21', an insulating interlayer 22 is formed over the substrate and in the insulating interlayer, are formed contact holes (CC-3, CC-2 and CC-1 each exposing among the junction regions the source 19-7 of the write pass transistor MM1, a common drain 19-6 of the write pass transistor MM1 and the storage transistor MM2 and the source 19-1 of the read pass transistor MM3. Thereafter, are formed metal wires 23A, 23B and 23C filling the contact holes and connected to the exposed junction regions.

To the source of the storage transistor, is connected the depletion transistor with a substrate electrode region of same conductivity as the substrate on which a storage transistor is formed, so the substrate voltage is applied to the source of the depletion transistor via therethrough. Accordingly, is required no area of contact hole for the separately additional metal wire, supplying the Vss voltage to the storage transistor. That is, cell area can be decreased by the contact hole area for Vss voltage supply, enhancing the high integration of the semiconductor device.

Figure 2:
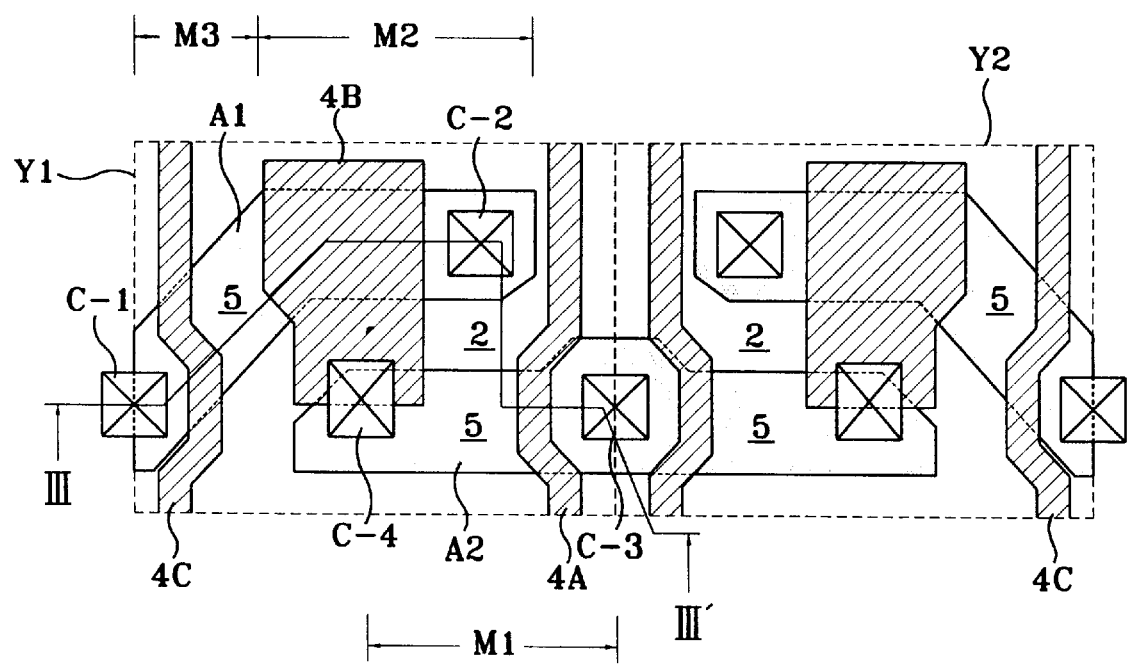
FIG. 2 is a layout of the circuit in FIG. 1.
Figure 3:
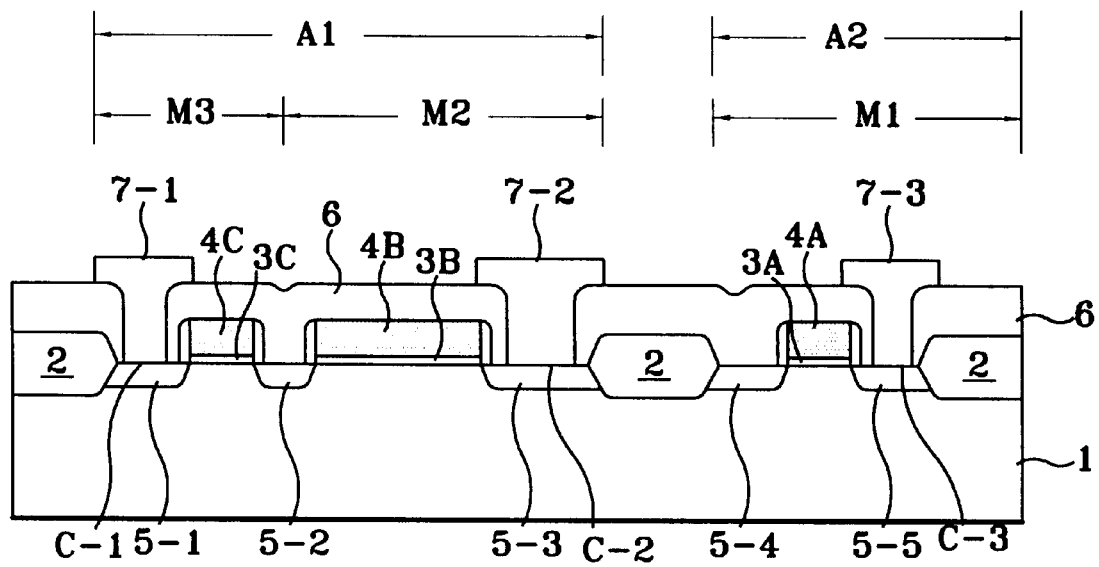
FIG. 3 is a sectional view along III–III' of FIG. 2.

Further, in case where DRAM of FIG. 2 and DRAM of FIG. 5 are manufactured in same cell area, if possible, distance between the metal wire 7-1 filling the contact hole C-1 and the metal wire 7-3 filling the contact hole C-3 in FIG. 2 is designed same as that between the metal wire 23C filling the contact hole CC-1 and the metal wire 23A filling the contact hole CC-3 in FIG.5. In FIG. 2, provided is the contact hole C-2 for connecting the Vss voltage to the source of the storage transistor. Accordingly, in the conventional art, since the distance between the metal wire 7-1 filling the contact hole C-1 and the metal wire 7-2 filling the contact hole C-2 and the distance between the metal wire 7-2 filling the contact hole C-2 and the metal wire 7-3 filling the contact hole C-3 are relatively smaller, the reliability of the semiconductor device is degraded. However, the embodiment according to the spirit of the present invention does not require a contact hole corresponding to the contact hole C-2. Therefore, can be reduced the degradation of the reliability of the semiconductor device owing to the decrease of metal pitch following the high integration of the semiconductor device Though all transistors in the present embodiment are of NMOS transistors, if an operation condition of DRAm is modified, a part or all of the write pass transistor, read pass transistor, the storage transistor and the depletion transistor can be formed of PMOS transistor. At this case, the substrate electrode region formed at the depletion transistor has same conductivity as that of the substrate on which above mentioned transistors are formed.

While the present invention has been particularly shown and described with reference to particular embodiments thereof, it will be understood by those skilled in the art that various changes in form and details may be effected therein without departing from the spirit and scope of the prevent invention as defined by the appended claims.

What is claimed is:

1. A semiconductor memory device comprising:
    a substrate;
    a first word line formed on said substrate;
    a second word line formed on said substrate;
    a first bit line formed on said substrate;
    a second bit line formed on said substrate;
    a first passer formed on said substrate and turned on when said first word line is accessed, for passing data loaded in said bit line;
    a storage formed on said substrate, for storing an output data from the first passer;
    a second passer formed on said substrate and turned on when said second word line is accessed, for transferring data stored in said storage to said second bit line; and
    a supplier formed on said substrate, for supplying a substrate voltage for said storage.

2. A semiconductor memory device as claimed in claim 1, wherein said supplier comprises an impurity region having same conductivity as that of said substrate.

3. A semiconductor memory device as claimed in claim 1, wherein said first word line and said second word line are respectively for writing and reading, and said first bit line and said second bit line are respectively for writing and reading.

4. A semiconductor memory device as claimed in claim 1, wherein said first passer is of NMOS transistor and the supplier is of depletion NMOS transistor with P type impurity region.

5. A semiconductor memory device as claimed in claim 1, wherein said second passer is of NMOS transistor.

6. A semiconductor memory device as claimed in claim 1, wherein said storage is of NMOS transistor.

7. A semiconductor memory device as claimed in claim 1, wherein said first passer, said second passer and said storage all are of NMOS transistor and said supplier is of depletion NMOS transistor with P type impurity region.

8. A semiconductor memory device as claimed in claim 7, wherein a gate, a source and a drain of said first passer are respectively connected to said first word line, said first bit line and a gate of said storage; a gate, a source and a drain of the second passer are respectively connected to said second word line, said second bit line and a drain of the storage; a source of the storage is connected to a source of said supplier; a gate of the supplier is connected to said first word line; said P type impurity region is formed at a part of said drain of said supplier; and said substrate voltage is connected to said P type impurity region.

9. A semiconductor memory device as claimed in claim 8, wherein a capacitor is formed between said drain of said first passer and said gate of said storage.

10. A semiconductor memory device as claimed in claim 9, wherein said drain of said second passer and said drain of said storage are common.

11. A semiconductor memory device comprising:
    a substrate;
    a first word line formed on said substrate;

a second word line formed on said substrate;

a first bit line formed on said substrate;

a second bit line formed on said substrate;

a first passer formed on said substrate and turned on when said first word line is accessed, for passing data loaded in said bit line;

a storage formed on said substrate, for storing an output data from the first passer;

a second passer formed on said substrate and turned on when said second word line is accessed, for transferring data stored in said storage to said second bit line; and a supplier formed on said substrate, for supplying a substrate voltage for said storage, said supplier having an impurity region of same conductivity as that of said substrate.

12. A semiconductor memory device as claimed in claim 11, wherein said first word line and said second word line are respectively for writing and reading, and said first bit line and said second bit line are respectively for writing and reading.

13. A semiconductor memory device as claimed in claim 11, wherein said first passer is of NMOS transistor and the supplier is of depletion NMOS transistor with P type impurity region.

14. A semiconductor memory device as claimed in claim 11, wherein said second passer is of NMOS transistor.

15. A semiconductor memory device as claimed in claim 11, wherein said storage is of NMOS transistor.

16. A semiconductor memory device as claimed in claim 11, wherein said first passer, said second passer and said storage both are of NMOS transistor and said supplier is of depletion NMOS transistor with P type impurity region.

17. A semiconductor memory device as claimed in claim 16, wherein a gate, a source and a drain of said first passer are respectively connected to said first word line, said first bit line and a gate of said storage; a gate, a source and a drain of the second passer are respectively connected to said second word line, said second bit line and a drain of the storage; a source of said storage is connected to a source of said supplier; a gate of said supplier is connected to said first word line; P type impurity region is formed at a part of said drain of said supplier; and said substrate voltage is connected to said P type impurity region.

18. A semiconductor memory device comprising:

a substrate;

a write word line formed on said substrate;

a read word line formed on said substrate;

a write bit line formed on said substrate;

a read bit line formed on said substrate;

a write pass NOMS transistor formed on said substrate and turned on when said write word line is accessed, for passing data loaded in said write bit line;

a storage NOMS transistor formed on said substrate, for storing an output data from the write pass NMOS transistor;

a read pass NMOS transistor formed on said substrate and turned on when said read word line is accessed, for transferring data stored in said storage NMOS transistor to said read bit line; and a supply depletion NMOS transistor formed on said substrate, for supplying a substrate voltage for said storage NMOS transistor, said supply depletion NMOS transistor having an impurity region of same conductivity as that of said substrate;

wherein a gate, a source and a drain of said write pass NMOS transistor are respectively connected to said write word line, said write bit line and a gate of said storage NMOS transistor; a gate, a source and a drain of the read pass NMOS transistor are respectively connected to said read word line, said read bit line and a drain of the storage NMOS transistor; a source of said storage NMOS transistor is connected to a source of said supply depletion NMOS transistor; a gate of the supply depletion NMOS transistor is connected to said write word line; said impurity region is formed at part of the drain of said supply depletion NMOS transistor, said impurity region being of P type conductivity; and said substrate voltage is connected to said P type impurity region.

19. A semiconductor memory device comprising:

a substrate;

a first active region of first conductivity type and formed on said substrate, said first active region having a body disposed at a center of a region defined by four-unit cells area adjacent thereto and branches disposed and extending from the body to respective unit cell area;

a second active region of the first conductivity type separated from the first active region by a selected distance and disposed over the two-unit cells area adjacent thereto;

a depletion region of the second conductivity formed in the body;

a substrate electrode region of the first conductivity disposed at a center of said depletion region;

a storage formed on the branch of the first active region;

a first passer formed on the branch of said first active region and connected to said storage;

a supplier formed on said depletion region including said substrate electrode region, for providing a substrate voltage for said storage through said substrate electrode region; and a second passer formed on the second active region and connected to said storage.

20. A semiconductor memory device as claimed in claim 19, wherein said supplier includes an impurity region of same conductivity as that of said substrate.

21. A semiconductor memory device as claimed in claim 19, wherein said first passer is a transistor with a first gate across said first active region and a first drain and a first source of second conductivity type both formed at said first active region disposed at sides of said first gate of; said supplier is a transistor having a second gate across said depletion region and a second drain and a second source of second conductivity type both formed at said depletion region disposed at sides of said second gate; and in a part of either said second source or said second drain is disposed said substrate electrode region formed by implanting first type of impurity ions.

22. A semiconductor memory device as claimed in claim 19, wherein said second passer is a transistor with a gate across said second active region and a drain and a source of the second conductivity type both formed at the second active region disposed at sides of the gate thereof.

23. A semiconductor memory device as claimed in claim 19, wherein said storage is a transistor having a gate disposed and extending from said first active region to said second active region and a drain and a source of the second conductivity type both formed at said first active region disposed at sides of said gate thereof.

24. A semiconductor memory device as claimed in claim 21, wherein said second passer is a transistor with a third gate across said second active region and extended from and integrated with said second gate and a third source and a third drain of the second conductivity type both formed at said second active region disposed at sides of said third gate.

25. A semiconductor memory device as claimed in claim 19, wherein said first passer is an NMOS transistor with a first gate across said first active region and a first source and a first drain of second conductivity both formed at the first active region disposed at sides of said first gate of; said supplier is a depletion NMOS transistor having a second gate across said depletion region and a second drain and a second source of second conductivity type both formed at said depletion region disposed at sides of said second gate; in a part of either said second source or said second drain is disposed said substrate electrode region formed by implanting first type of impurity ions; said second passer is an NMOS transistor with said second gate across said second active region and a third drain and a third source of the second conductivity type both formed at the second active region disposed at sides of said second gate; and said storage is an NMOS transistor having a third gate disposed and extending from said first active region to said second active region and a fourth drain and a fourth source of the second conductivity type both formed at said first active region disposed at sides of said third gate.

26. A semiconductor memory device as claimed in claim 25, wherein said first drain of the first passer and said fourth drain of the storage are common.

27. A semiconductor memory device as claimed in claim 25, wherein a width of said third gate larger than those of said first gate and said second gate.

28. A semiconductor memory device as claimed in claim 19, wherein said first conductivity is P type and said second conductivity is N type.

29. A semiconductor memory device comprising:
   a substrate;
   a first active region of first conductivity type and formed on said substrate, said first active region having a body disposed at a center of a region defined by four-unit cells area adjacent thereto and branches disposed and extending from the body to respective unit cell area;
   a second active region of the first conductivity type separated from the first active region by a selected distance and disposed over the two-unit cells area adjacent thereto;
   a depletion region of the second conductivity formed in the body;
   a substrate electrode region disposed at a center of said depletion region, said substrate electrode having same conductivity as that of said substrate;
   a storage formed on the branch of the first active region, a first passer formed on the branch of the first active region and connected to said storage;
   a supplier formed on said depletion region including the substrate electrode region, for providing a substrate voltage for said storage through said substrate electrode region; and
   a second passer formed on said second active region and connected to said storage.

30. A semiconductor memory device as claimed in claim 29, wherein said first passer is a transistor with a first gate across said first active region and a first drain and a first source of second conductivity type both formed at the first active region disposed at sides of said first gate; said supplier is a transistor having a second gate across said depletion region and a second drain and a second source of second conductivity type both formed at said depletion region disposed at sides of said second gate; and in a part of either said second source or said second drain is disposed said substrate electrode region formed by implanting first type of impurity ions.

31. A semiconductor memory device as claimed in claim 29, wherein said second passer is a transistor with a gate across said second active region and a drain and a source of the second conductivity type both formed at said second active region disposed at sides of said gate thereof.

32. A semiconductor memory device as claimed in claim 29, wherein said storage is a transistor having a gate disposed and extending from said first active region to said second active region and a drain and a source of the second conductivity type both formed at said first active region disposed at sides of said gate thereof.

33. A semiconductor memory device as claimed in claim 29, wherein said first passer is an NMOS transistor with a first gate across said first active region and a first source and a first drain of second conductivity both formed at the first active region disposed at sides of said first gate; said supplier is a depletion NMOS transistor having a second gate across both said depletion region and said second active region and a second drain and a second source of second conductivity type both formed at said depletion region disposed at sides of said second gate; in a part of either said second source or said second drain is disposed said substrate electrode region formed by implanting first type of impurity ions; said second passer is an NMOS transistor with said second gate and a third drain and a third source of the second conductivity type both formed at the second active region disposed at sides of said second gate; and said storage is an NMOS transistor having a third gate disposed and extending from said first active region to said second active region and a fourth drain and a fourth source of the second conductivity type both formed at said first active region disposed at sides of said third gate.

34. A semiconductor memory device comprising:
   a substrate;
   a first active region of first conductivity type formed on said substrate, said first active region having a body disposed at a center of a region defined by four-unit cells area adjacent thereto and branches disposed and extending from the body to respective unit cell area;
   a second active region of the first conductivity type separated from the first active region by a selected distance and disposed over the two-unit cells area adjacent thereto;
   a depletion region of the second conductivity formed in the body;
   a substrate electrode region disposed at a center of the depletion region, said substrate electrode having first conductivity, same conductivity as that of said substrate;
   a storage NMOS transistor formed on the branch of the first active region,
   a write pass NMOS transistor formed on the branch of the first active region and connected to the storage NMOS transistor;
   a supply depletion NMOS transistor formed on the depletion region including said substrate electrode region, for providing a substrate voltage for said storage NMOS transistor through said substrate electrode region; and
   a read pass MMOS transistor formed on the second active region and connected to said storage NMOS transistor;

wherein, said write pass NMOS transistor has a first gate across said first active region and a first source and a first drain of second conductivity both formed at the first active region disposed at sides of said first gate;

said supply depletion NMOS transistor has a second gate across said depletion region and a second drain and a second source of second conductivity type both formed at said depletion region disposed at sides of said second gate; in a part of either said second source or said second drain is disposed said substrate electrode region formed by implanting first type of impurity ions; said read pass NMOS transistor has said second gate and a third drain and a third source of the second conductivity type both formed at the second active region disposed at sides of said second gate; and said storage NMOS transistor has a third gate disposed and extending from said first active region to said second active region and a fourth drain and a fourth source of the second conductivity type both formed at said first active region disposed at sides of said third gate.

* * * * *